United States Patent
Yamaguchi et al.

(10) Patent No.: US 10,346,553 B2
(45) Date of Patent: Jul. 9, 2019

(54) DETERMINING APPARATUS, PROGRAM, AND METHOD

(71) Applicant: FUJITSU LIMITED, Kawasaki-shi, Kanagawa (JP)

(72) Inventors: Atsushi Yamaguchi, Kawasaki (JP); Hiroyuki Furuya, Kawasaki (JP); Akira Ueda, Yokohama (JP); Koji Demizu, Atsugi (JP); Hiromi Fukino, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1712 days.

(21) Appl. No.: 13/872,477

(22) Filed: Apr. 29, 2013

(65) Prior Publication Data

US 2013/0325412 A1    Dec. 5, 2013

(30) Foreign Application Priority Data

May 31, 2012   (JP) .................................. 2012-125012

(51) Int. Cl.
*G06F 17/50* (2006.01)

(52) U.S. Cl.
CPC .......... *G06F 17/50* (2013.01); *G06F 17/5086* (2013.01)

(58) Field of Classification Search
CPC ............................. G06F 17/50; G06F 17/5086
USPC ............................................................ 703/1
See application file for complete search history.

(56) References Cited

U.S. PATENT DOCUMENTS

| | | | | |
|---|---|---|---|---|
| 6,321,070 | B1 * | 11/2001 | Clark | H04M 1/0214 455/347 |
| 2003/0202667 | A1 | 10/2003 | Sekine | |
| 2004/0122672 | A1 | 6/2004 | Bonastre et al. | |
| 2005/0131658 | A1 * | 6/2005 | Mei | G06T 19/00 703/1 |
| 2009/0103704 | A1 | 4/2009 | Kitada et al. | |
| 2011/0064247 | A1 * | 3/2011 | Ickler | G10K 11/025 381/117 |
| 2011/0250477 | A1 | 10/2011 | Yoshida et al. | |
| 2011/0257942 | A1 * | 10/2011 | Ankory | G06Q 10/04 703/1 |

(Continued)

FOREIGN PATENT DOCUMENTS

| | | |
|---|---|---|
| JP | 11-266490 | 9/1999 |
| JP | 2003-316371 | 11/2003 |
| JP | 2004-199077 | 7/2004 |

(Continued)

*Primary Examiner* — Rehana Perveen
*Assistant Examiner* — Justin C Mikowski
(74) *Attorney, Agent, or Firm* — Staas & Halsey LLP

(57) ABSTRACT

There is provided a determining apparatus which includes a first extractor configured to extract space inside an electronic device from a model indicating the electronic device, the electronic device including a plurality of audio output apparatus and a plurality of ribs, a second extractor configured to extract the plurality of ribs from the model, a divider configured to divide the space into a plurality of chambers, the plurality of chambers being partitioned by the plurality of ribs, and a determining unit configured to determine respective rear chambers to each of the plurality of audio output apparatus so that the rear chambers satisfies a certain parameter, the rear chambers being formed by combination of one or more chambers determined by the determining unit.

5 Claims, 11 Drawing Sheets

(56) References Cited

U.S. PATENT DOCUMENTS

2013/0197871 A1\* 8/2013 Furuya .................... G06F 17/50
 703/1

FOREIGN PATENT DOCUMENTS

JP 2010-153117 7/2010
WO WO 2007/060753 A1 5/2007

\* cited by examiner

DETERMINING APPARATUS, PROGRAM, AND METHOD

CROSS-REFERENCE TO RELATED APPLICATION

This application is based upon and claims the benefit of priority of the prior Japanese Patent Application No. 2012-125012, filed on May 31, 2012, the entire contents of which are incorporated herein by reference.

FIELD

The embodiment discussed herein is related to a determining apparatus, a determining program, and a determining method.

BACKGROUND

There exists technology for developing devices such as electronic devices using computer-aided design (CAD). A description citing specific examples will now be given. For example, in the case of mounting multiple speakers or other audio output apparatus that output audio (acoustic components) onboard a device, the properties of the audio that is outer differs depending on the magnitude of the volume of the rear chamber of an audio output apparatus, and on the ratio of volumes of the rear chambers of the multiple audio output apparatus. Consequently, with the above technology, after structurally designing the device exterior, circuit substrate, and battery, for example, CAD is used to generate a model illustrating the structurally designed device, and calculate the volume of the empty space inside the device illustrated by the generated model. Then, with the above technology, the user divides the empty space with the computed volume such that the magnitude or ratio of the volume of each audio output apparatus satisfies given parameters. Subsequently, with the above technology, partitioning walls made up of ribs, for example, are generated at the boundary portions of the divided space. In this way, with the above technology, rear chambers for multiple audio output apparatus are computed. Herein, for a speaker that includes a speaker component that outputs audio and a speaker box, for example, a rear chamber refers to the space inside the speaker that is formed by the speaker box.

For additional information, see Japanese Laid-open Patent Publication No. 2004-199077, Japanese Laid-open Patent Publication No. 2003-316371, International Publication Pamphlet No. WO 2007/060753, Japanese Laid-open Patent Publication No. 2010-153117, and Japanese Laid-open Patent Publication No. 11-266490, for example.

However, the above technology is problematic in that information regarding the rear chambers of audio output apparatus may not be easily obtained.

For example, with the above technology, the user divides the empty space with the computed volume such that the magnitude or ratio of the volume of each audio output apparatus satisfies given parameters. Then, with the above technology, partitioning walls made up of ribs, for example, are generated at the boundary portions of the divided space. However, if the design is furthered to satisfy many parameters, including the strength from the structural design, the initially determined rear chamber ratios may in some cases diverge greatly from the given parameters under ordinary design. In this way, with the above technology, although the user carries out the work of dividing empty space so as to satisfy given parameters, it is difficult to uniquely compute division positions for satisfying given parameters. Consequently, information regarding the rear chambers of audio output apparatus may not be easily obtained with the above technology.

SUMMARY

According to an aspect of the invention, a determining apparatus includes a first extractor configured to extract space inside an electronic device from a model indicating the electronic device, the electronic device including a plurality of audio output apparatus and a plurality of ribs, a second extractor configured to extract the plurality of ribs from the model, a divider configured to divide the space into a plurality of chambers, the plurality of chambers being partitioned by the plurality of ribs, and a determining unit configured to determine respective rear chambers to each of the plurality of audio output apparatus so that the rear chambers satisfies a certain parameter, the rear chambers being formed by combination of one or more chambers determined by the determining unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Being devised in light of the above description in the background, it is desired to provide a determining apparatus, a determining program, and a determining method able to easily obtain information regarding the rear chambers of audio output apparatus.

Hereinafter, an embodiment of a determining apparatus, a determining program, and a determining method disclosed in this specification will be described in detail on the basis of the drawings. However, the embodiment does not limit the disclosed technology.

Embodiment

Figure 1:
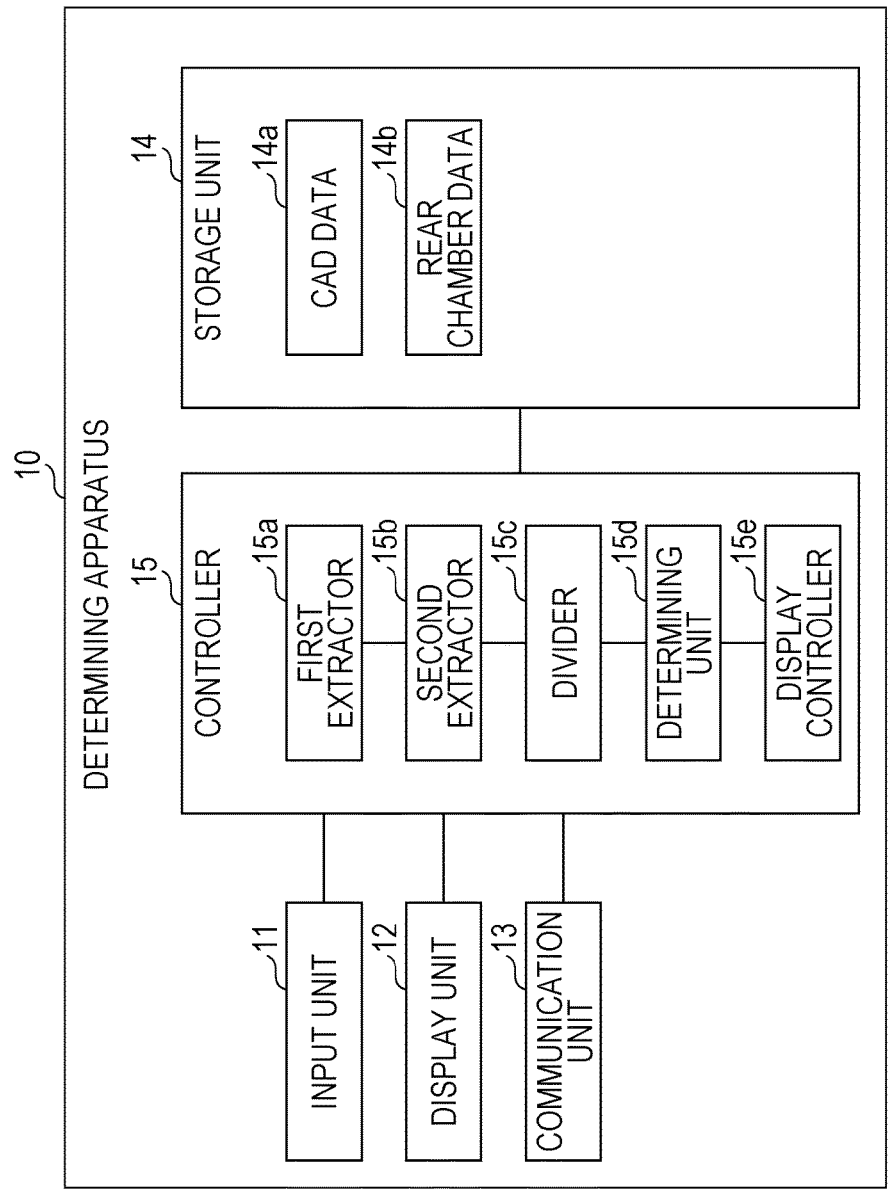
FIG. 1 is a diagram illustrating an exemplary functional configuration of a determining apparatus according to the embodiment.

A determining apparatus according to the embodiment will now be described. FIG. 1 is a diagram illustrating an exemplary functional configuration of a determining apparatus according to the embodiment.

[Functional Configuration of Determining Apparatus]

As illustrated in FIG. 1, the determining apparatus 10 includes an input unit 11, a display unit 12, a communication unit 13, a storage unit 14, and a controller 15.

The input unit 11 inputs various information. The input unit 11 is also used to specify and select various information. For example, the input unit 11 may receive instructions for executing a determining process discussed later from the user, and input the received instructions into the controller 15. Note that such instructions may include speaker identification information for specifying a loudspeaker discussed later, hereinafter a loudspeaker is referred to as a speaker, as well as the volume ratio of the rear chamber of the specified speaker.

Potential examples of a device for the input unit 11 include a mouse, keyboard, or other device that accepts user operations.

The display unit 12 displays various images. For example, the display unit 12 may display a model of the rear chambers of each speaker together with their volume ratio, under control by a display controller 15e discussed later. Potential examples of a device for the display unit 12 include a liquid crystal display (LCD).

The communication unit 13 is an interface for communicating with other apparatus. For example, the communication unit 13 may be connected to a server not illustrated. Potential examples of such a server include a server that displays a model of a rear chamber of a speaker, together with its volume ratio, on a display unit. Upon receiving rear chamber data 14b discussed later which has been transmitted from the display controller 15e discussed later, the communication unit 13 transmits the received rear chamber data 14b to the server. Accordingly, the server displays the model and volume ratio of the speaker rear chamber indicated by the rear chamber data 14b.

The storage unit 14 stores various information. For example, the storage unit 14 may store CAD data 14a and rear chamber data 14b.

The CAD data 14a is data expressing a three-dimensional (3D) model of an electronic device. For example, the CAD data 14a may include identifiers (IDs) for identifying each of multiple component models included in the electronic device, IDs for identifying each face of the multiple component models, and 3D coordinates for the vertices of each face for specifying the region of each face. The CAD data 14a may also include attributes indicating component model materials. The CAD data 14a may also include IDs for identifying a speaker in the case where a component model is a speaker. In the description hereinafter, an ID for identifying a component model is designated a "component ID", while an ID for identifying a speaker is designated a "speaker ID" in some cases.

Figure 2:
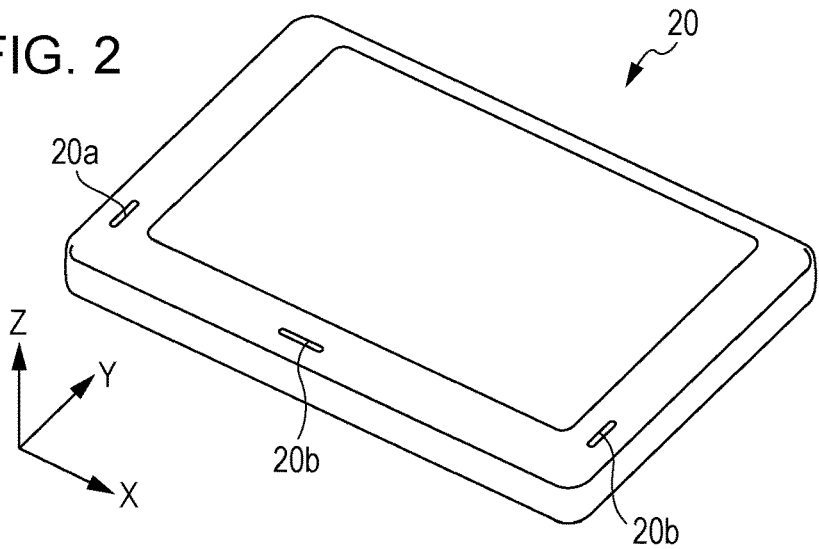
FIG. 2 is a diagram illustrating an exemplary model of an electronic device indicated by CAD data.

FIG. 2 is a diagram illustrating an exemplary model of an electronic device indicated by CAD data. The example in FIG. 2 illustrates a 3D model 20 of an electronic device. The electronic device indicated by the model 20 internally includes ribs, which act as stiffeners, and three speakers. Holes 20a, 20b, and 20c are formed on an exterior face of the electronic device indicated by the model 20, and are for outputting respective audio from the three speakers externally to the electronic device.

The storage unit 14 is a storage apparatus such as flash memory or another semiconductor memory element, or alternatively, a hard disk (HDD) or optical disc. Note that the storage unit 14 is not limited to the above types of storage apparatus, and may also be random access memory (RAM), or read-only memory (ROM).

The controller 15 includes internal memory for storing a program defining various processing sequences and control data, by means of which various processes are executed. As illustrated in FIG. 1, the controller 15 includes a first extractor 15a, a second extractor 15b, a divider 15c, a determining unit 15d, and a display controller 15e.

Figure 3:
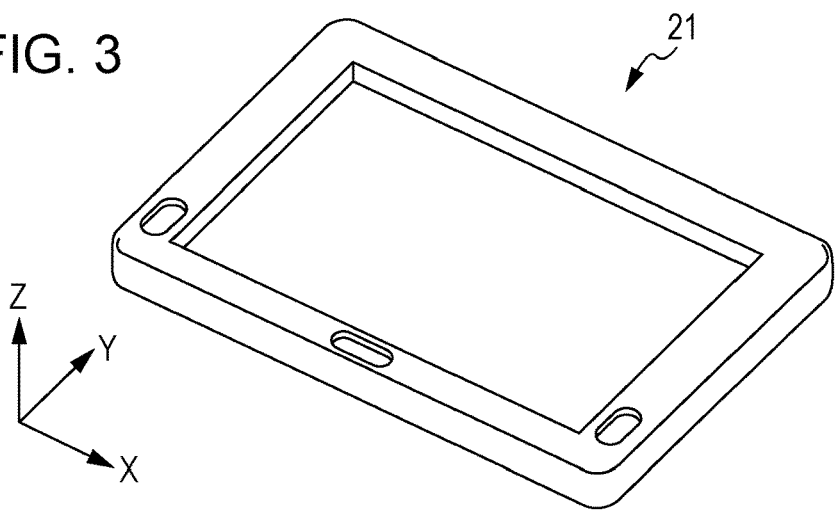
FIG. 3 is a diagram illustrating an exemplary model of empty space.

The first extractor 15a extracts empty space inside an electronic device from a model indicating the electronic device that includes multiple speakers, which output audio, and ribs. To describe citing a specific example, the first extractor 15a acquires CAD data 14a from the storage unit 14 when instructions for conducting a determining process are received from the input unit 11. Then, the first extractor 15a generates multiple cross-sections in a given direction of the model 20 of an electronic device indicated by the CAD data 14a, such as multiple height cross-sections in the Z axis direction, for example. Subsequently, for each of the multiple cross-sections, the first extractor 15a determines regions where a component model exists, and regions where a component model does not exist. After that, the first extractor 15a stacks the regions of the multiple cross-sections where a component model does not exist, and generates CAD data indicating a model of empty space. FIG. 3 is a diagram illustrating an exemplary model of empty space 21. The model of empty space 21 illustrated by the example in FIG. 3 is a model indicating empty space in the model 20 of an electronic device indicated by the example in the earlier FIG. 2. However, the first extractor 15a is not limited to the method discussed above, and may also extract empty space from a model of an electronic device using another established technology, for example.

The first extractor 15a specifies speakers included in the model 20 of an electronic device, which are indicated by speaker IDs included in the instructions for conducting the determining process. The first extractor 15a conducts the following process in the case where the speaker IDs included in the instructions are the speaker IDs S1, S2, and S3 of the three speakers which output audio from the holes 20a, 20b, and 20c, respectively. Namely, the first extractor 15a specifies the speaker indicated by the speaker ID S1, the speaker indicated by the speaker ID S2, and the speaker indicated by the speaker ID S3.

The first extractor 15a extracts the faces of the empty space adjoining the specified speakers. For example, the first extractor 15a extracts the face of the empty space adjoining the speaker indicated by the speaker ID S1. The first extractor 15a also extracts the face of the empty space adjoining the speaker indicated by the speaker ID S2. In addition, the first extractor 15a extracts the face of the empty space adjoining the speaker indicated by the speaker ID S3.

Figure 4:
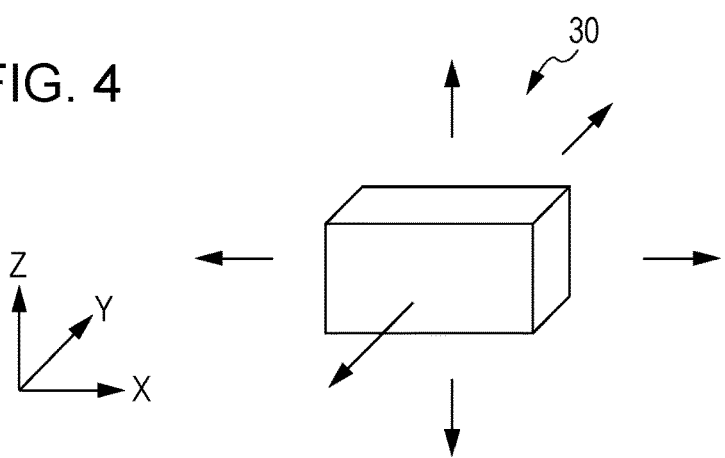
FIG. 4 is a diagram for describing an exemplary process executed by a determining apparatus according to the embodiment.

The second extractor 15b extracts ribs from the model indicating the electronic device. To describe citing a specific example, the second extractor 15b first conducts a process like the following in the case where the first extractor 15a extracts empty space and extracts the faces of the empty space adjoining speakers. Namely, the second extractor 15b extracts six exterior faces of the electronic device indicated by the model, whose respective normal vectors are taken to be the respective vectors in the six directions along the positive and negative X axis, the positive and negative Y axis, and the positive and negative Z axis. FIG. 4 is a diagram for describing an exemplary process executed by a determining apparatus according to the embodiment. The example in FIG. 4 illustrates the case where the model of an electronic device indicated by CAD data is a model 30. The example in FIG. 4 illustrates the case of the second extractor 15b extracting six exterior faces of the electronic device indicated by the model 30, whose respective normal vectors are taken to be the respective vectors in the six directions along the positive and negative X axis, the positive and negative Y axis, and the positive and negative Z axis.

Figure 5:
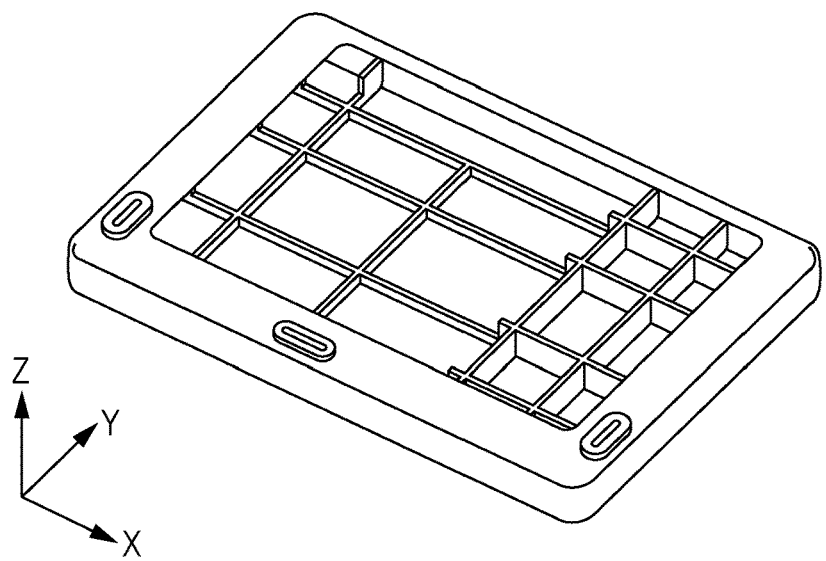
FIG. 5 is a diagram for describing an exemplary process executed by a determining apparatus according to the embodiment.
Figure 6:
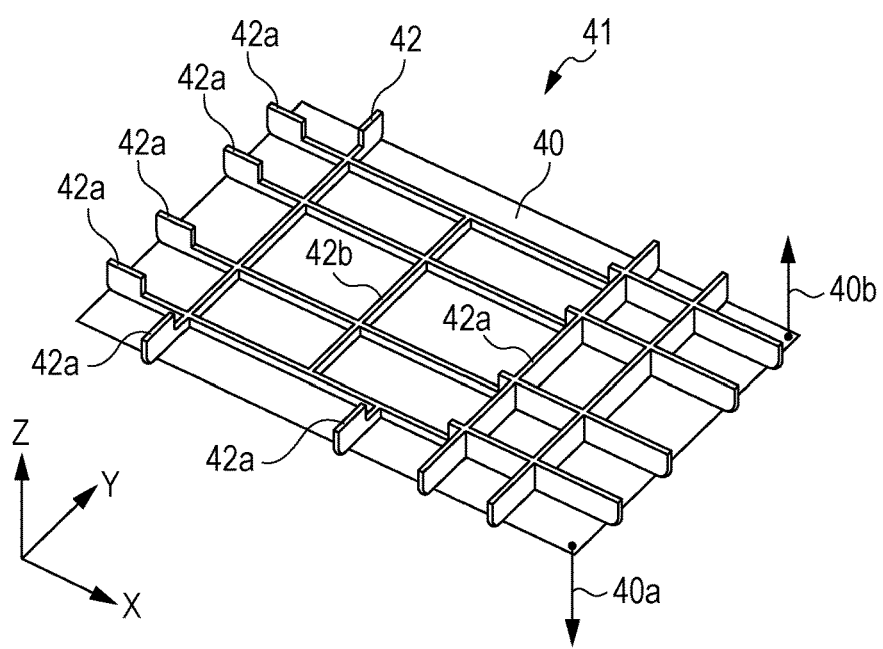
FIG. 6 is a diagram for describing an exemplary process executed by a determining apparatus according to the embodiment.

The second extractor 15b then specifies the exterior face with the largest surface area from among the extracted six exterior faces. Subsequently, the second extractor 15b extracts an exterior component, being the component having the specified exterior face. The second extractor 15b then specifies, from among all faces of the extracted exterior component, the faces whose normal vector is taken to be the vector in the opposite direction of the direction of the normal vector to the specified exterior face. Thus, it is possible to specify the faces of the exterior component on the side opposite to the direction of the normal vector to the specified exterior face, or in other words, the face of the exterior component in the interior of the electronic device. FIGS. 5 and 6 are diagrams for describing an exemplary process executed by a determining apparatus according to the embodiment. The example in FIG. 5 is a diagram illustrating an example of the extracted six exterior faces, and a model of the exterior component having an exterior face. The example in FIG. 6 illustrates the case where the second extractor 15b specifies the exterior face 40 with the largest surface area from among the extracted six exterior faces, and extracts the exterior component 41 having the exterior face 40 from the model illustrated by the example in FIG. 5. The example in FIG. 6 also illustrates the case where the second extractor 15b specifies, from among all faces 42 of the extracted exterior component 41, the faces 42a and 42b whose normal vector is taken to be the vector in the direction 40b opposite to the direction 40a of the normal vector to the specified exterior face 40. Note that in the example in FIG. 6, the face 42a and the face 42b have differing heights in the direction 40b, or in other words, differing heights in the Z axis direction.

Subsequently, the second extractor 15b computes the heights in the opposite direction for all faces of the exterior component on that side opposite to the direction of the normal vector to the specified exterior face. For example, in the above example in FIG. 6, the second extractor 15b computes two heights: the height of the face 42a in the direction 40b, and the height of the face 42b in the direction 40b.

The second extractor 15b then determines whether or not an unselected height exists among the computed heights. For example, in the case of computing the two respective heights for the face 42a and the face 42b as illustrated by the above example in FIG. 6, the second extractor 15b determines whether or not an unselected height exists from among the height of the face 42a and the height of the face 42b. In the case where an unselected height does exist, the second extractor 15b selects one unselected height. The second extractor 15b then projects the face at the selected height onto a plane parallel to the face at the selected height. For example, in the case of selecting the height of the face 42a, the second extractor 15b projects the face 42a onto the XY plane parallel to the face 42a. Additionally, in the case of selecting the height of the face 42b, the second extractor 15b projects the face 42b onto the XY plane parallel to the face 42b.

Figure 7:
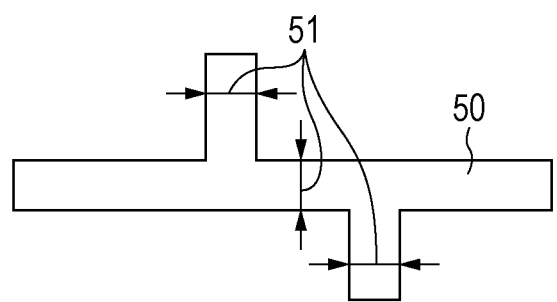
FIG. 7 is a diagram for describing an exemplary process executed by a determining apparatus according to the embodiment.

Subsequently, the second extractor 15b determines whether or not the region of the face at the selected height projected onto a parallel plane has a width less than or equal to a given value $\alpha$. Herein, in the case where the exterior component is a rib, the maximum value of the width of the face on the opposite side of the exterior face of that exterior component may be adopted as the given value $\alpha$. FIG. 7 is a diagram for describing an exemplary process executed by a determining apparatus according to the embodiment. The example in FIG. 7 illustrates the case where the second extractor 15b projects the face 50 at a selected height onto the XY plane. In the example in FIG. 7, the second extractor 15b determines whether or not the width 51 is less than or equal to the given value $\alpha$. At this point, it is conceivable that the face at the selected height forms part of a rib in the case where the region of the face at the selected height projected onto a plane has a width that is less than or equal to the given value $\alpha$. In this case, the second extractor 15b once again conducts the above-described process of determining whether or not an unselected height exists among the computed heights, and once again conducts the processes thereafter.

Meanwhile, it is conceivable that the face at the selected height does not form part of a rib and that the exterior component having the face at the selected height is not a rib in the case where the region of the face at the selected height projected onto a plane has a width that is not less than or equal to the given value $\alpha$. For this reason, the second extractor 15b stores information indicating that the exterior component having the face at the selected height is not a rib in the internal memory of the controller 15.

In the case where an unselected height does not exist among the computed heights, it is conceivable that the exterior component having faces at the selected heights, or in other words the extracted exterior component, is a rib, and thus the second extractor 15b conducts a process like the following. Namely, the second extractor 15b stores information indicating that the extracted exterior component is a rib in the internal memory of the controller 15.

The second extractor 15b is also able to extract components with a "plastic" attribute as ribs, even for components inside the electronic device rather than exterior components. In this case, the second extractor 15b stores information indicating that a component with the "plastic" attribute is a rib in the internal memory of the controller 15.

As discussed above, the second extractor 15b extracts ribs from the model indicating the electronic device.

The divider 15c determines, from information stored in the internal memory, whether or not ribs have been extracted. In the case where ribs have been extracted, the divider 15c divides the empty space extracted by the first extractor 15a into multiple spaces (a plurality of chambers) partitioned by the ribs extracted by the second extractor 15b. Each of the multiple spaces divided by the ribs becomes a candidate for the rear chamber of a speaker. Note that if the empty space is simply divided into multiple spaces partitioned by the ribs, the models of the ribs will still be included in the models having the multiple spaces. For this reason, the divider 15c removes the models of the ribs from the models including the multiple spaces. Hereinafter, the multiple spaces obtained as a result of dividing may be respectively designated "divisions" in some cases.

The determining unit 15d determines which of the multiple divisions are to become the respective rear chambers of the multiple speakers, such that the volume ratio of the rear chambers of the multiple speakers becomes a given ratio. To describe citing a specific example, the determining unit 15d conducts a process like the following when the divider 15c divides the empty space into multiple divisions. Namely, for each speaker specified by the first extractor 15a, the determining unit 15d associates the speaker ID of that speaker with a division having the face adjoining that speaker that was extracted by the first extractor 15a. Thus, it is possible to associate a division adjoining a speaker with that speaker. For example, the determining unit 15d may conduct a process like the following in the case where N speakers are specified by the first extractor 15a, with the N speakers having the respective speaker IDs S1, S2, and so on to SN. In other words, for each of the N speakers, the determining unit 15d associates a speaker ID SK (where K=1 to N) with a division having the face adjoining a speaker that was extracted by the first extractor 15a. Hereinafter, a case will be described in which N speakers are specified by the first extractor 15a, with the N speakers having the respective speaker IDs S1, S2, and so on to SN.

Subsequently, the determining unit 15d respectively sets the volumes of the divisions respectively adjoining the N speakers to the variables a1, a2, and so on to aN. Note that the variables a1 to aN respectively correspond to the speakers indicated by the speaker IDs S1 to SN.

The determining unit 15d then determines whether or not a division without an associated speaker ID exists among the multiple divisions. The determining unit 15d may conduct a process like the following in the case where a division without an associated speaker ID exists. Namely, the determining unit 15d performs the processing of dividing each of the variables a1 to aN by a numerical value cK (where K=1 to N) corresponding to each speaker from the volume ratio c1:c2: . . . :cN included in the instructions, and as a resultant obtains a1/c1, a2/c2, and so on to aN/cN. The determining unit 15d then respectively sets each of the computed values (a1/c1 to aN/cN) to the variables b1 to bN.

Subsequently, the determining unit 15d specifies a variable bM (where M=1 to N) set to the minimum value among the variables b1 to bN. After that, the determining unit 15d further searches for space adjoining the division with associated speaker ID SM. The determining unit 15d then associates also the speaker ID SM with the division having the largest volume from among the divisions obtained by the search results. Thus, the determining unit 15d is able to determine the divisions that will become the rear chambers of each speaker such that their volumes are in accordance with the ratio c1:c2: . . . :cN. The determining unit 15d then adds the volume of the division with the newly associated speaker ID SM to the variable aM. The determining unit 15d repeats such processes until speaker IDs are associated with all divisions, or alternatively, until space adjoining a division with a newly associated speaker ID SM is no longer found by search.

The determining unit 15d then conducts a process like the following in the case where speaker IDs are associated with all divisions, or alternatively, space adjoining a division with a newly associated speaker ID SM is no longer found by search. Namely, the determining unit 15d generates, for each speaker ID, CAD data for a model of the division with the associated speaker ID. Thus, it is possible to automatically generate CAD data for models of the rear chambers of each speaker such that their volumes are in accordance with the ratio c1:c2: . . . :cN. The determining unit 15d then generates rear chamber data 14b associating the ratio c1:c2: . . . :cN and the actual volume ratio a1:a2: . . . :aN with the generated CAD data, and stores the generated rear chamber data 14b in the storage unit 14.

Figure 8:
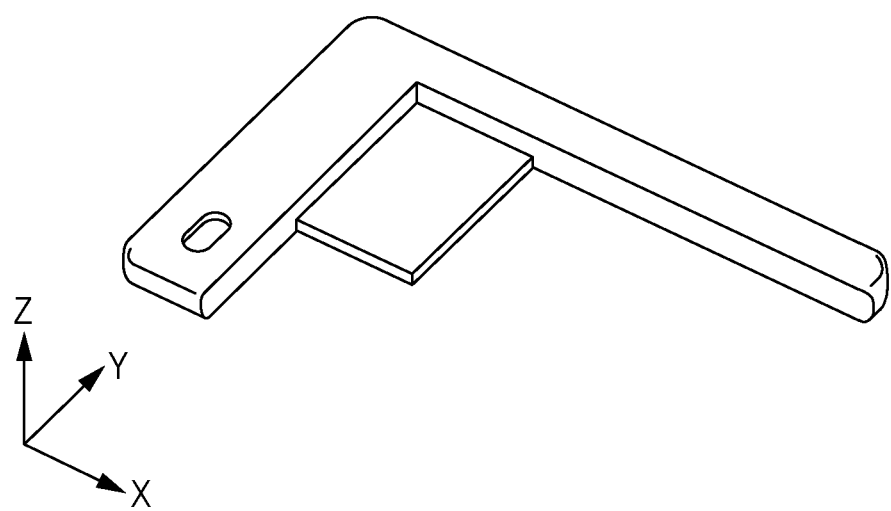
FIG. 8 is a diagram for describing an exemplary process executed by a determining apparatus according to the embodiment.

The display controller 15e acquires the rear chamber data 14b stored in the storage unit 14, and controls the display unit 12 to display content indicated by the rear chamber data 14b. For example, the display controller 15e may control the display unit 12 to display the rear chamber model for each speaker indicated by the rear chamber data 14b, or display the ratio c1:c2: . . . :cN and the actual volume ratio a1:a2: . . . :aN arranged in a way that enables comparison therebetween. Thus, the user is able to check the automatically generated rear chamber models. The user is also able to compare the ratio c1:c2: . . . :cN included in the instructions to the actual volume ratio a1:a2: . . . :aN FIG. 8 is a diagram for describing an exemplary process executed by a determining apparatus according to the embodiment. The example in FIG. 8 illustrates a rear chamber model for a speaker, displayed by the display unit 12 under control by the display controller 15e. By having the display controller 15e cause the display unit 12 to display a rear chamber model as illustrated by the example in FIG. 8, the user is able to check an automatically generated rear chamber model. In addition, the display controller 15e outputs the rear chamber data 14b to the communication unit 13 for transmission to the server discussed earlier.

The controller 15 is an integrated circuit, such as an application-specific integrated circuit (ASIC) or field-programmable gate array (FPGA), or an electronic circuit, such as a central processing unit (CPU) or microprocessing unit (MPU).

[Process Flow]

Figure 9:
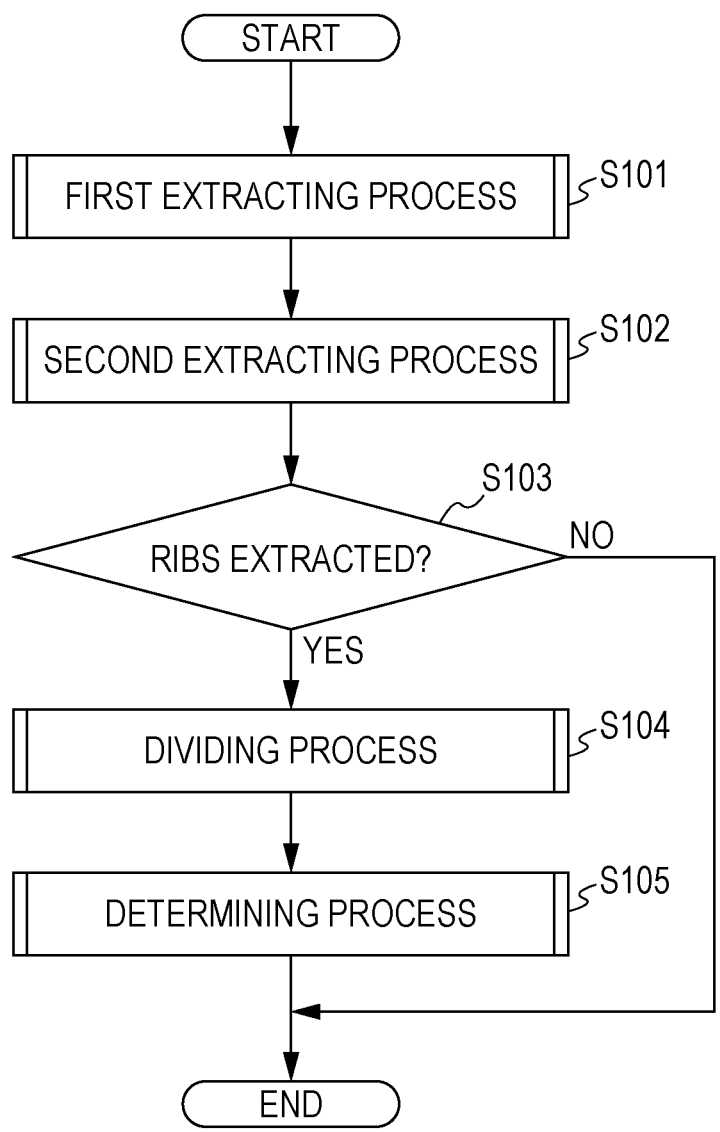
FIG. 9 is a flowchart illustrating the sequence of a determining process according to the embodiment.

Next, the flow of a process conducted by the determining apparatus 10 according to the embodiment will be described. FIG. 9 is a flowchart illustrating the sequence of a determining process according to the embodiment. The determining process is executed when the controller 15 receives instructions for executing a determining process from the input unit 11, for example.

As illustrated in FIG. 9, the first extractor 15a executes a first extracting process (S101). The second extractor 15b then executes a second extracting process (S102). The divider 15c then determines, from information stored in the internal memory, whether or not ribs have been extracted (S103). In the case where ribs are not extracted (S103, No), the process ends. Meanwhile, in the case where ribs are extracted (S103, Yes), the divider 15c executes a dividing process (S104). After that, the determining unit 15d and the display controller 15e execute a determining process (S105), and the process ends.

Figure 10:
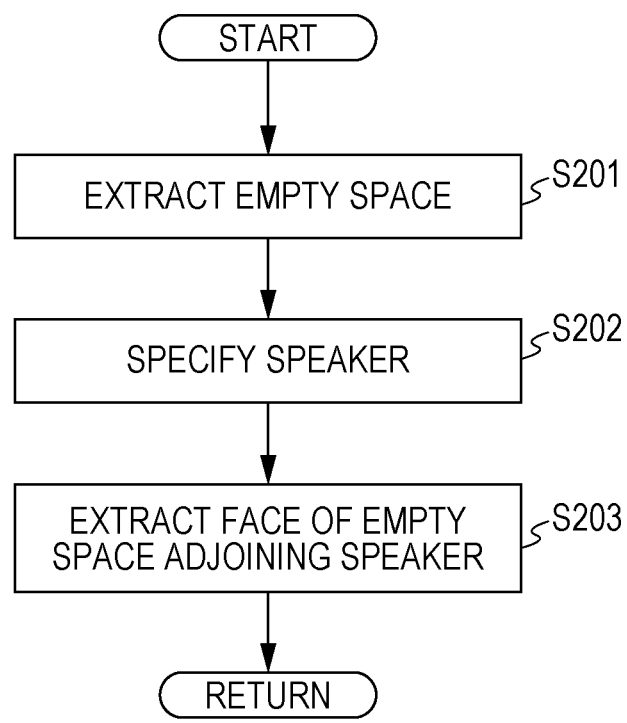
FIG. 10 is a flowchart illustrating the sequence of a first extracting process according to the embodiment.

Next, the first extracting process will be described. FIG. 10 is a flowchart illustrating the sequence of the first extracting process according to the embodiment. As illustrated in FIG. 10, the first extractor 15a acquires CAD data 14a from the storage unit 14, extracts the empty space in the model 20 of an electronic device indicated by the CAD data 14a, and generates CAD data indicating a model of the empty space (S201).

Subsequently, the first extractor 15a specifies speakers included in the model 20 of an electronic device, which are indicated by speaker IDs included in the instructions for conducting the determining process (S202). The first extractor 15a then extracts the faces of the empty space adjoining the specified speakers (S203), stores the processing results in the internal memory of the controller 15, and the process returns to the parent process.

Figure 11:
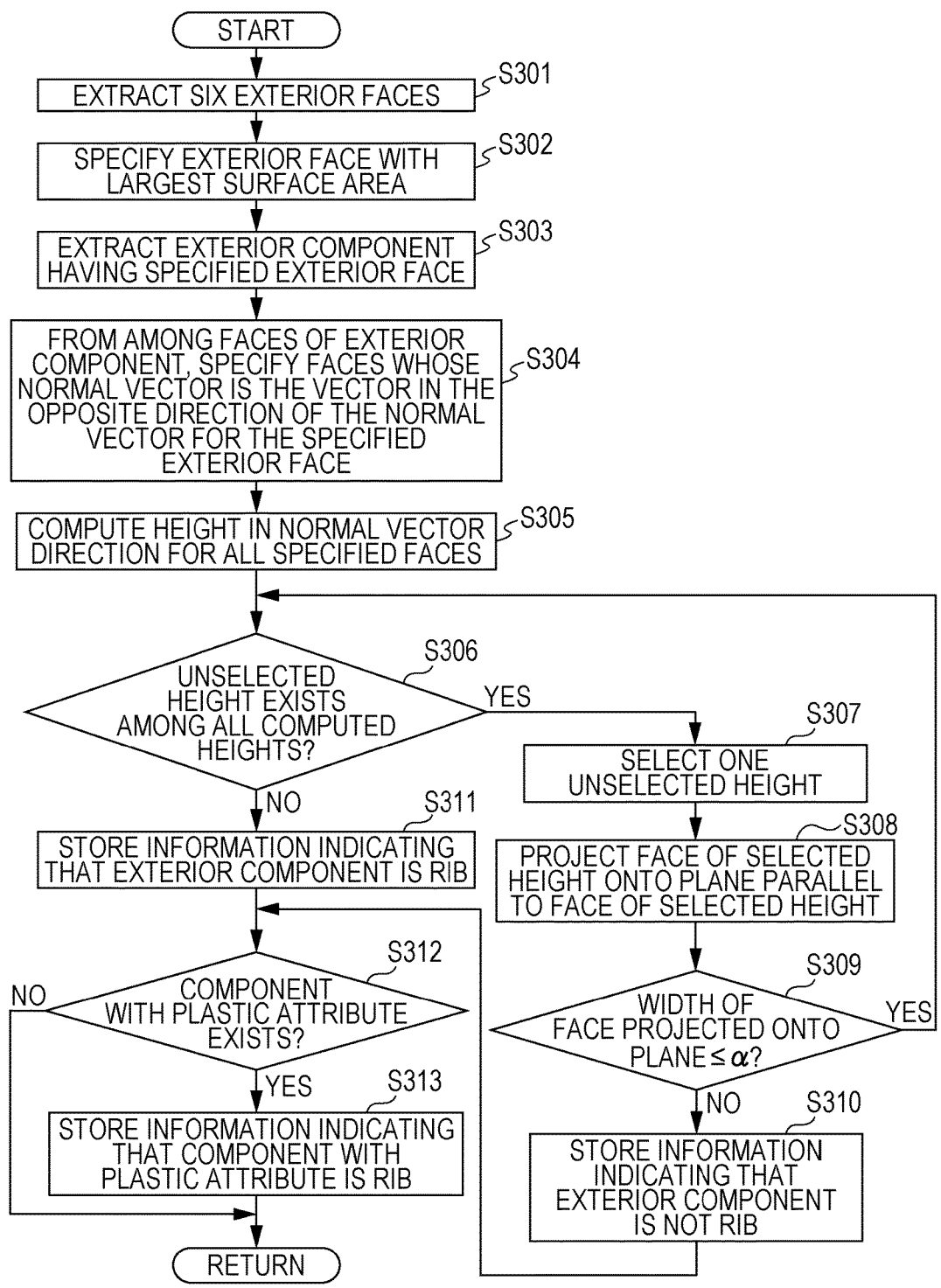
FIG. 11 is a flowchart illustrating the sequence of a second extracting process according to the embodiment.

Next, the second extracting process will be described. FIG. 11 is a flowchart illustrating the sequence of the second extracting process according to the embodiment. As illustrated in FIG. 11, the second extractor 15b extracts six exterior faces of the electronic device indicated by the model, whose respective normal vectors are taken to be the respective vectors in the six directions along the positive and negative X axis, the positive and negative Y axis, and the positive and negative Z axis (S301).

The second extractor 15b then specifies the exterior face with the largest surface area from among the extracted six exterior faces (S302). Subsequently, the second extractor 15b extracts an exterior component, being the component having the specified exterior face (S303). The second extractor 15b then specifies, from among all faces of the extracted exterior component, the faces whose normal vector is taken to be the vector in the opposite direction of the direction of the normal vector to the specified exterior face (S304).

Subsequently, the second extractor 15b computes the heights of all faces of the specified exterior component in the direction of the normal vector in the opposite direction (S305).

The second extractor 15b then determines whether or not an unselected height exists among the computed heights (S306). In the case where an unselected height does exist (S306, Yes), the second extractor 15b selects one unselected height (S307). The second extractor 15b then projects the face at the selected height onto a plane parallel to the face at the selected height (S308).

Subsequently, the second extractor 15b determines whether or not the region of the face at the selected height projected onto a parallel plane has a width that is less than or equal to a given value $\alpha$ (S309). The process returns to S306 in the case where the region of the face at the selected height projected onto a parallel plane has a width that is less than or equal to the given value $\alpha$ (S309, Yes).

Meanwhile, in the case where the region of the face at the selected height projected onto a parallel plane has a width that is not less than or equal to the given value $\alpha$ (S309, No), the second extractor 15b stores information indicating that the exterior component having the face at the selected height is not a rib in the internal memory of the controller 15 (S310), and the process proceeds to S312.

Meanwhile, in the case where an unselected height does not exist (S306, No), the second extractor 15b stores information indicating that the extracted exterior component is a rib in the internal memory of the controller 15 (S311).

The second extractor 15b then determines whether or not a component with the "plastic" attribute exist among the internal components of the electronic device (S312). In the case where a component with the "plastic" attribute does exist (S312, Yes), the second extractor 15b stores information indicating that the component with the "plastic" attribute is a rib in the internal memory of the controller 15 (S313), and the process returns to the parent process. Also, in the case where a component with the "plastic" attribute does not exist (S312, No), the second extractor 15b stores the processing results in the internal memory of the controller 15, and the process returns to the parent process.

Figure 12:
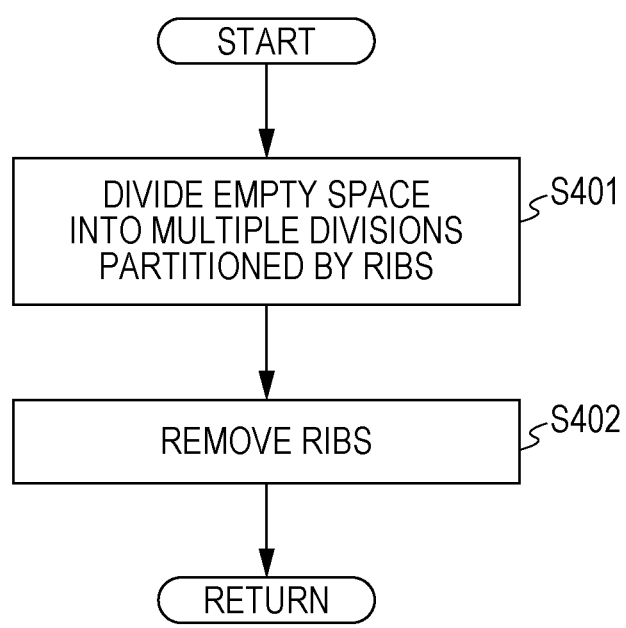
FIG. 12 is a flowchart illustrating the sequence of a dividing process according to the embodiment.

Next, the dividing process will be described. FIG. 12 is a flowchart illustrating the sequence of a dividing process according to the embodiment. As illustrated in FIG. 12, the divider 15c divides empty space into multiple divisions partitioned by ribs (S401). The divider 15c then removes the models of the ribs from the models including the multiple spaces (S402), stores the processing results in the internal memory, and the process returns to the parent process.

Figure 13:
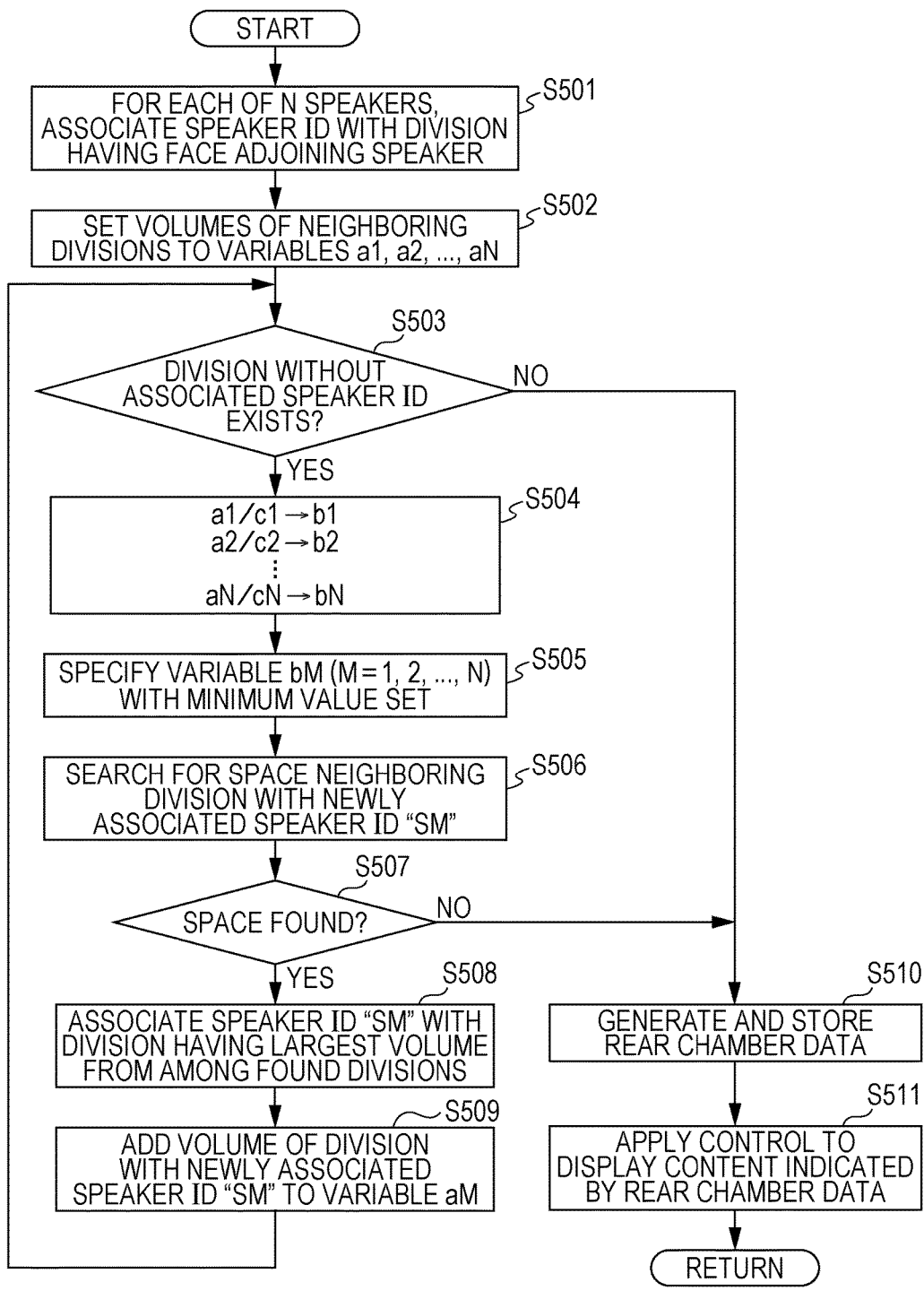
FIG. 13 is a flowchart illustrating the sequence of a determining process according to the embodiment.

Next, the determining process will be described. FIG. 13 is a flowchart illustrating the sequence of a determining process according to the embodiment. As illustrated in FIG. 13, for each of the specified N speakers, the determining unit 15d associates a speaker ID SK (where K=1 to N) with a division having the face adjoining that speaker that was extracted by the first extractor 15a (S501).

Subsequently, the determining unit 15d respectively sets the volumes of the divisions respectively adjoining the N speakers to the variables a1, a2, and so on to aN (S502).

The determining unit 15d then determines whether or not a division without an associated speaker ID exists among the multiple divisions (S503). The determining unit 15d may conduct a process like the following in the case where a division without an associated speaker ID exists S503, Yes). Namely, the determining unit 15d computes the values obtained by dividing each of the variables a1 to aN by a numerical value cK (where K=1 to N) corresponding to each speaker from the volume ratio c1:c2: . . . :cN included in the instructions (thus, a1/c1, a2/c2, and so on to aN/cN). The determining unit 15d then respectively sets each of the computed values (a1/c1 to aN/cN) to the variables b1 to bN (S504). The determining unit 15d then specifies a variable bM (where M=1 to N) set to the minimum value among the variables b1 to bN (S505). After that, the determining unit 15d searches for a division adjoining the division with the associated speaker ID SM (S506). After that, the determining unit 15d determines whether or not divisions were obtained by the search results (S507). In the case where divisions were obtained by the search results (S507, Yes), the determining unit 15d associates the speaker ID SM with the division having the largest volume from among the divisions obtained by the search results (S508). The determining unit 15d then adds the volume of the all divisions with the associated speaker ID SM to the variable aM (S509), and the process returns to S503.

Meanwhile, in the case where a division without an associated speaker ID does not exist (S503, No) and in the case where a division is not obtained by the search results (S507, No), the determining unit 15d generates and stores rear chamber data 14b in the storage unit 14 (S510).

The display controller 15e then acquires the rear chamber data 14b stored in the storage unit 14, and controls the display unit 12 to display content indicated by the rear chamber data 14b (S511), stores the processing results in the internal memory, and the process returns to the parent process.

As discussed earlier, the determining apparatus 10 according to the embodiment generates, for each speaker ID, rear chamber data 14b that includes CAD data for models of divisions with associated speaker IDs. In this way, the determining apparatus 10 automatically generates a rear chamber model for each speaker such that their volumes are in accordance with the ratio c1:c2: . . . :cN. Consequently, according to the determining apparatus 10, it is possible to easily obtain information regarding the rear chambers of speakers.

In addition, according to the determining apparatus 10, it is possible to obtain a rear chamber model for each speaker such that their volumes are in accordance with the ratio c1:c2: . . . :cN.

Also, with the determining apparatus 10, it is possible to compute information regarding the rear chambers automatically rather than manually, even in the case of correcting the structural design after structurally designing components such as the device exterior, circuit board, and battery, and once again computing information regarding the rear chamber of each speaker. Thus, according to the determining apparatus 10, it is possible to easily obtain information regarding the rear chambers.

Although the foregoing describes an example related to an apparatus according to the disclosure, various different embodiments other than the example discussed in the foregoing are possible. Accordingly, other examples will now be described hereinafter.

For example, the foregoing example illustrates the case where the determining unit 15d determines the divisions that will become the respective rear chambers for each speaker such that the volume ratio of the rear chambers of the multiple speakers becomes a given ratio. However, an apparatus according to the disclosure is not limited thereto. For example, the determining unit 15d may also determine the divisions that will become the respective rear chambers of the multiple speakers, such that the magnitudes of the volumes of the respective rear chambers of the multiple speakers become given magnitudes. An exemplary determining process executed by a determining apparatus according to a modification for this case will now be described. First, assume that specifications d1 to dN for the magnitudes of the volumes of the respective rear chambers of the multiple speakers are included in the instructions for executing the determining process. Similarly to the foregoing, the determining unit 15d then determines whether or not a division without an associated speaker ID exists, and conducts a process like the following in the case where a division without an associated speaker ID does exist. Namely, the determining unit 15d computes the values obtained by subtracting each of the corresponding variables a1 to aN from a respective numerical value dK (where K=1 to N) corresponding to each speaker from the volume magnitudes d1 to dN included in the instructions (thus, d1−a1, d2−a2, and so on to dN−aN). The determining unit 15d then respectively sets each of the computed values (d1−a1 to dN−aN) to the variables b1 to bN. Subsequently, the determining unit 15d determines whether or not any of the variables b1 to bN have a value that is less than 0.

In the case where a variable with a value less than 0 does not exist, the determining unit 15d specifies a variable bM (where M=1 to N) set to the minimum value among the variables b1 to bN, similarly to the foregoing, and conducts the following process. Meanwhile, in the case where a variable with a value less than 0 does exist, the determining unit 15d generates, for each speaker ID, CAD data for a model of the division with the associated speaker ID. Thus, it is possible to automatically generate CAD data for models of the rear chambers of each speaker such that their volumes are in accordance with the volume magnitudes d1 to dN. The determining unit 15d then generates rear chamber data 14b associating the volume magnitudes d1 to dN and the actual volumes a1 to aN with the generated CAD data, and stores the generated rear chamber data 14b in the storage unit 14.

According to the determining apparatus 10 in this case, it is possible to easily obtain information regarding the rear chambers of speakers. In addition, according to an embodiment of the disclosure, it is possible to automatically obtain a rear chamber model for each speaker such that their volumes are in accordance with the volume magnitudes d1 to dN.

Figure 14:
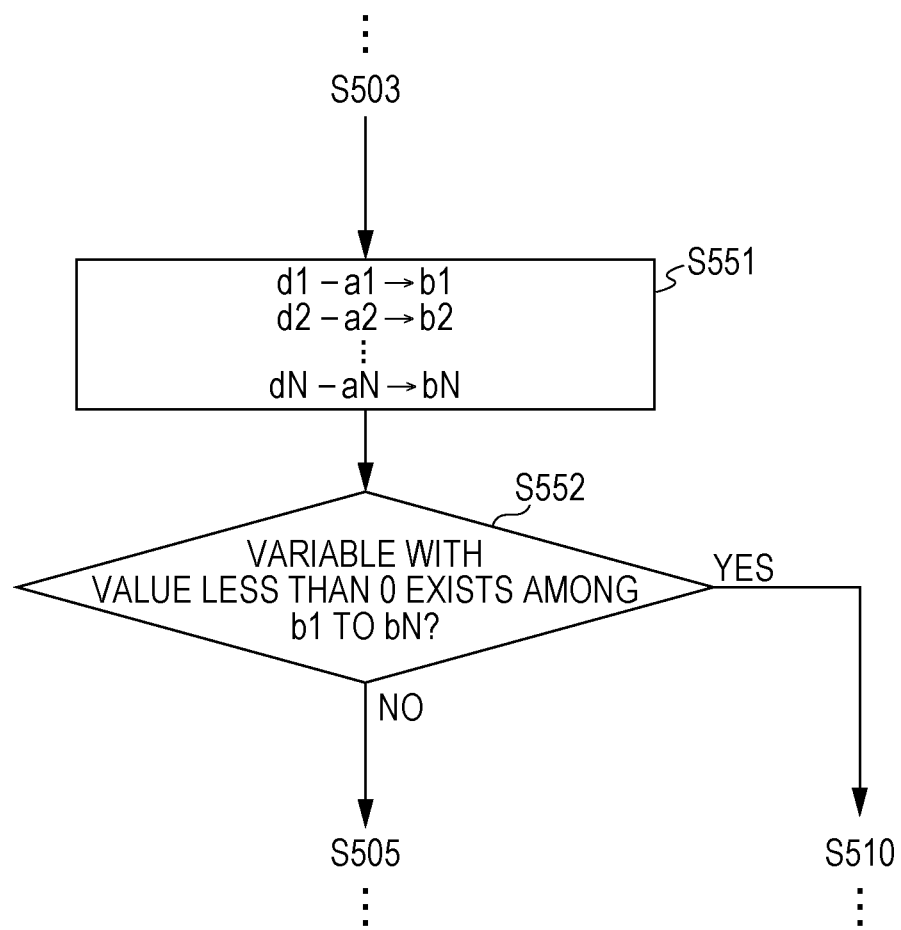
FIG. 14 is a flowchart illustrating the sequence of a determining process according to a modification.

FIG. 14 is a flowchart illustrating the sequence of a determining process according to the modification. As illustrated in FIG. 14, in the determining process according to the modification, S551 and S552 are executed instead of S504 in the flowchart illustrated in FIG. 13. As illustrated in FIG. 14, the determining unit 15d conducts a process like the following after the processing in S503. Namely, the determining unit 15d computes the values obtained by subtracting each of the variables a1 to aN from the volume magnitudes d1 to dN included in the instructions (thus, d1−a1, d2−a2, and so on to dN−aN) (S551). The determining unit 15d then respectively sets each of the computed values (d1−a1 to dN−aN) to the variables b1 to bN, and determines whether or not any of the variables b1 to bN have a value that is less than 0 (S552). The process proceeds to S505 in the case where a variable with a value less than 0 does not exist (S552, No). Meanwhile, the process proceeds to S510 in the case where a variable with a value less than 0 does exist (S552, Yes).

Additionally, it is also possible to manually conduct all or part of the processes described in the embodiment as being conducted automatically. Furthermore, it is also possible to automatically conduct, with established methods, all or part of the processes described in the embodiment as being conducted manually.

Also, the processes in each step of each process described in each example may be arbitrarily split or combined according to factors such as various loads or usage conditions. It is also possible to omit some steps.

Furthermore, the order of the processes in each step of each process described in each example may be modified according to factors such as various loads or usage conditions.

The components of the respective apparatus illustrated in the drawings are functional and conceptual illustrations, and are not limited to being physically configured exactly as depicted in the drawings. In other words, the specific state in which respective apparatus are separated or joined is not limited to that illustrated in the drawings, and all or part thereof may be functionally or physically separated or joined in arbitrary units according to factors such as various loads and usage conditions.

[Determining Program]

Figure 15:
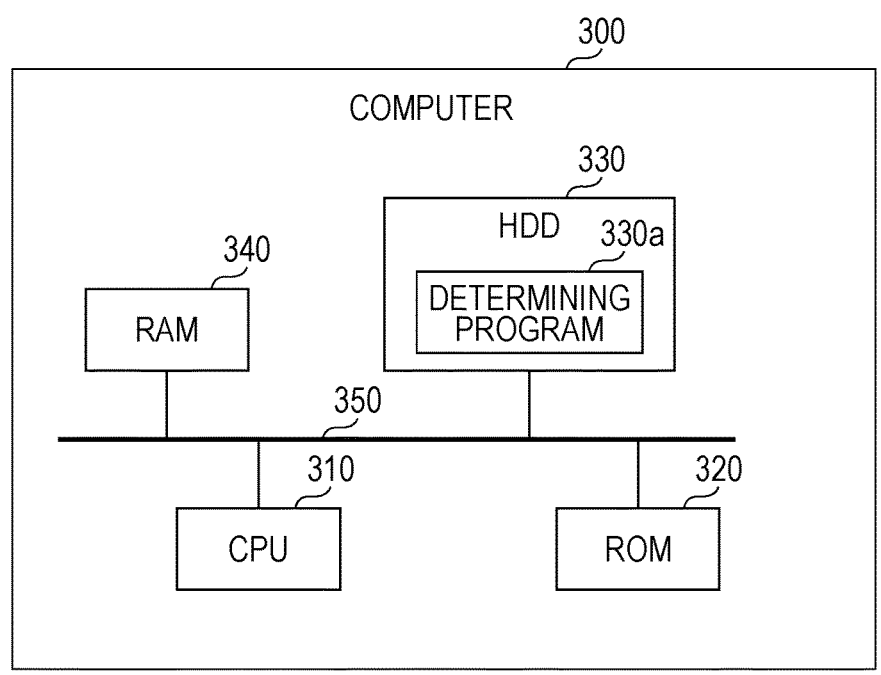
FIG. 15 is a diagram illustrating a computer that executes a determining program.

Moreover, it is also possible to realize the various processes of the determining apparatus 10 described in the foregoing examples by executing a program prepared in advance on a computer system such as a personal computer or workstation. Accordingly, an exemplary computer that executes a determining program having functionality similar to that of the determining apparatus 10 described in the foregoing examples will be hereinafter described using FIG. 15. FIG. 15 is a diagram illustrating a computer that executes a determining program.

As illustrated in FIG. 15, the computer 300 includes a CPU 310, ROM 320, an HDD 330, and RAM 340. The CPU 310, the ROM 320, the HDD 330, and the RAM 340 are connected to each other via a bus 350.

The ROM 320 stores core programs such as an OS. A determining program 330a that exhibits functionality similar to the first extractor 15a, the second extractor 15b, the divider 15c, the determining unit 15d, and the display controller 15e illustrated in the foregoing examples is stored in advance in the HDD 330. Note that the determining program 330a may also be split up as appropriate. Information such as CAD data and rear chamber data is also provided in the HDD 330. Such CAD data and rear chamber data corresponds to the CAD data 14a and the rear chamber data 14b discussed earlier.

The CPU 310 then retrieves and executes the determining program 330a from the HDD 330.

The CPU 310 also retrieves information such as CAD data and rear chamber data, and stores retrieved information in the RAM 340. The CPU 310 then executes the determining program 330a using information such as the CAD data and rear chamber data stored in the RAM 340. Note that the respective data stored in the RAM 340 is not limited to being stored entire in the RAM 340 throughout. It is sufficient for the data being used in a process to be stored in the RAM 340.

Note that the above determining program 330a is not limited to being stored in the HDD 330 from the beginning.

For example, a program may be stored on a portable physical medium such as a flexible disk (FD), CD-ROM, DVD disc, magneto-optical disc, or IC card inserted into the computer 300. The computer 300 may then retrieve the program therefrom and execute the program.

Furthermore, a program may be stored on apparatus such as another computer (or server) connected to the computer 300 via a public network, the Internet, a LAN, or a WAN. The computer 300 may then retrieve the program therefrom and execute the program.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus comprising:
   a memory; and
   a processor coupled to the memory and configured to:
   based on data representing structure of a modeled electronic apparatus including a plurality of speaker devices and a plurality of ribs, extract a plurality of spaces in the modeled electronic apparatus,
   associate one of the plurality of speaker devices with one of the plurality of spaces facing the one of the plurality of speaker devices, respectively,
   divide each of the plurality of associated spaces based on a predetermined condition,
   assign a plurality of the divided spaces facing each of the plurality of speaker devices, respectively, as respective rear chambers for the plurality of speaker devices,
   store data of the respective rear chambers, and
   control a display to display content based on the data of the respective rear chambers.

2. The information processing apparatus according to claim 1, wherein the predetermined condition is a volume ratio of the respective rear chambers for the plurality of speaker devices.

3. The information processing apparatus according to claim 1, wherein the predetermined condition is magnitudes of volumes of the respective rear chambers for the plurality of speaker devices.

4. A non-transitory computer-readable storage medium storing a program causing a computer to execute a process comprising:
   based on data representing structure of a modeled electronic apparatus including a plurality of speaker devices and a plurality of ribs, extracting a plurality of spaces in the modeled electronic apparatus;
   associating one of the plurality of speaker devices with one of the plurality of spaces facing the one of the plurality of speaker devices, respectively;
   dividing each of the plurality of associated spaces based on a predetermined condition,
   assigning a plurality of the divided spaces facing each of the plurality of speaker devices, respectively, as respective rear chambers for the plurality of speaker devices;
   storing data of the respective rear chambers; and
   controlling a display to display content based on the data of the respective rear chambers.

5. A method comprising:
   executing, by a processor coupled to a memory, a process that includes,
   based on data representing structure of a modeled electronic apparatus including a plurality of speaker devices and a plurality of ribs, extracting a plurality of spaces in the modeled electronic apparatus;
   associating one of the plurality of speaker devices with one of the plurality of spaces facing the one of the plurality of speaker devices, respectively;
   dividing each of the plurality of associated spaces based on a predetermined condition,
   assigning a plurality of the divided spaces facing each of the plurality of speaker devices, respectively, as respective rear chambers for the plurality of speaker devices;
   storing data of the respective rear chambers; and
   controlling a display to display content based on the data of the respective rear chambers.

* * * * *